US012777684B2

(12) United States Patent
Tan

(10) Patent No.: US 12,777,684 B2
(45) Date of Patent: Oct. 27, 2026

(54) THIN FILM TRANSISTOR, METHOD FOR MANUFACTURING THE SAME, AND ARRAY SUBSTRATE

(71) Applicant: Shenzhen China Star Optoelectronics Semiconductor Display Technology Co., Ltd., Shenzhen (CN)

(72) Inventor: Jincheng Tan, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 373 days.

(21) Appl. No.: 18/395,410

(22) Filed: Dec. 22, 2023

(65) Prior Publication Data

US 2025/0006845 A1 Jan. 2, 2025

(30) Foreign Application Priority Data

Jun. 27, 2023 (CN) ......................... 202310770719.2

(51) Int. Cl.

| | |
|---|---|
| ***H10D 30/67*** | (2025.01) |
| ***H10D 30/01*** | (2025.01) |
| ***H10D 62/83*** | (2025.01) |
| ***H10D 64/62*** | (2025.01) |

(52) U.S. Cl.

CPC ..... *H10D 30/6746* (2025.01); *H10D 30/0321* (2025.01); *H10D 30/673* (2025.01); *H10D 62/83* (2025.01); *H10D 64/62* (2025.01)

(58) Field of Classification Search

CPC ........... H10D 30/6746; H10D 30/0321; H10D 30/673; H10D 62/83; H10D 64/62; H10D 30/0316; H10D 30/6706; H10D 30/6739; H10D 30/6732; H10D 64/01; H10D 64/514; H10D 86/431; H10D 86/60; H10D 86/40; H10D 86/425; H10D 86/427; H10D 86/471; H10D 30/6728; H10D 30/6723; H10D 30/6755; H10D 62/80; H10D 86/0221; H10D 86/0231; H10D 86/423; H10D 99/00; H10D 30/6713; H10D 30/67–6759; H10D 30/031–0327; H10D 86/021–0251; C23C 14/35; G02F 1/1343; G02F 1/13363; G03F 5/16; H10K 10/46–491; H10K 50/30; H10K 19/10; H10K 59/125;

(Continued)

(56) References Cited

U.S. PATENT DOCUMENTS

2020/0035714 A1* 1/2020 Cho .................. H10D 30/0316

* cited by examiner

*Primary Examiner* — Moin M Rahman
(74) *Attorney, Agent, or Firm* — PV IP PC; Peter Stecher; Wei Te Chung

(57) ABSTRACT

Disclosed are a thin film transistor, a method of manufacturing the same, and an array substrate. The thin film transistor includes a substrate, a gate, a gate insulating layer, an active layer, an ohmic contact layer, and a source-drain electrode layer, the gate insulating layer includes at least a first gate insulating layer deposited at a low rate, a second gate insulating layer deposited at a high rate, and a third gate insulating layer deposited at a low rate, the first gate insulating layer is in contact with the gate, the third gate insulating layer is in contact with the active layer, and the first gate insulating layer and the third gate insulating layer have a density greater than a density of the second gate insulating layer.

14 Claims, 2 Drawing Sheets

(58) Field of Classification Search
CPC ....... H10K 10/481–482; H10K 10/464; H10K 10/466; H10K 10/84
See application file for complete search history.

THIN FILM TRANSISTOR, METHOD FOR MANUFACTURING THE SAME, AND ARRAY SUBSTRATE

CROSS-REFERENCE TO RELATED APPLICATION

This application claims priority to Chinese Patent Application No. 202310770719.2, filed in the China National Intellectual Property Administration on Jun. 27, 2023, entitled "THIN FILM TRANSISTOR, METHOD FOR MANUFACTURING THE SAME, AND ARRAY SUBSTRATE", the entire contents of which are incorporated herein by reference.

TECHNICAL FIELD

The present disclosure relates to a field of display technologies, and more particularly, to a thin film transistor, a manufacturing method thereof, and an array substrate.

BACKGROUND

TFT backplane technology based on amorphous silicon thin film transistors (a-Si TFT) is a mainstream technology for current AM-LCD displays, in which a technology of applying a back channel etching (BCE) process to a-Si TFT to achieve low manufacturing costs is a current major mass production technology.

In actual mass production, a method of manufacturing the amorphous silicon thin film transistor generally includes: a substrate preheating, a surface treatment before forming a film, SiNx film formation, front channel treatment, a-Si film formation, ohmic contact layer film formation, static elimination. In the process of converting the surface previous-treatment step with $NH_3$ to the SiNx film formation step, when the flow rate of $SiH_4$ is too high, decomposition of $SiH_4$ is insufficient, resulting in the formation of foreign matter (Particle) due to formation of abnormal SiNx (non-ideal SiNx thin film), and point defect, line defect, Electrostatic Discharge (ESD), and the like, caused by the foreign matter formed by Chemical Vapor Deposition (CVD) film deposition are the main causes of yield loss in the BCE process.

In view of the problem of the foreign matter formation during the CVD film formation process of the amorphous silicon thin film transistor, the present disclosure provides a thin film transistor, a method for manufacturing the thin film transistor, and an array substrate to improve the above problem.

SUMMARY

An embodiment of the present disclosure provides a thin film transistor including: a substrate; a gate disposed above the substrate; a gate insulating layer disposed at a side of the gate away from the substrate; an active layer disposed at a side of the gate insulating layer away from the gate; an ohmic contact layer disposed at a side of the active layer away from the gate insulating layer; a source-drain electrode layer disposed at a side of the ohmic contact layer away from the gate insulating layer. The gate insulating layer includes at least a first gate insulating layer deposited at a low rate, a second gate insulating layer deposited at a high rate, and a third gate insulating layer deposited at a low rate, the first gate insulating layer is in contact with the gate, the third gate insulating layer is in contact with the active layer, and the first gate insulating layer and the third gate insulating layer have a density greater than a density of the second gate insulating layer.

An embodiment of the present disclosure provides a method for manufacturing a thin film transistor, the method includes: providing a substrate; forming a gate on the substrate; depositing a first gate insulating layer on the gate at a low rate, depositing a second gate insulating layer on the first gate insulating layer at a high rate, and depositing a third gate insulating layer on the second gate insulating layer at a low rate; forming an active layer on the third gate insulating layer, and patterning the active layer; forming an ohmic contact layer, a source-drain electrode layer, and a passivation layer on the active layer sequentially.

An embodiment of the present disclosure provides an array substrate including the thin film transistor described in any one of the above embodiments.

DESCRIPTION OF DRAWINGS

In order to more clearly explain the technical solutions in the embodiments of the present disclosure, the following will briefly introduce the drawings required in the description of the embodiments. Obviously, the drawings in the following description are only some embodiments of the present disclosure. For those skilled in the art, without paying any creative work, other drawings can be obtained based on these drawings.

DETAILED DESCRIPTION

Figure 1:
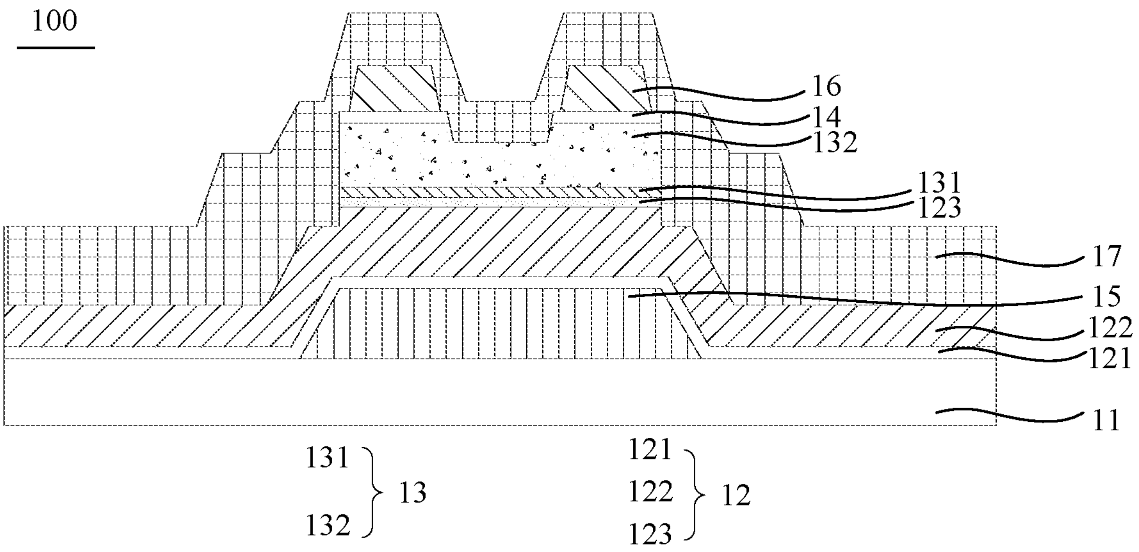
FIG. 1 is a schematic structural diagram of a thin film transistor according to an embodiment of the present disclosure.

Technical solutions in embodiments of the present disclosure will be clearly and completely described below in conjunction with drawings in the embodiments of the present disclosure. Obviously, the described embodiments are only a part of embodiments of the present disclosure, rather than all the embodiments. Based on the embodiments in the present disclosure, all other embodiments obtained by those skilled in the art without creative work fall within the protection scope of the present disclosure.

In the description of the present disclosure, it should be understood that orientations or position relationships indicated by the terms "center", "longitudinal", "lateral", "length", "width", "thickness", "upper", "lower", "front", "rear", "left", "right", "vertical", "horizontal", "top", "bottom", "inside", "outside", and the like, are based on orientations or position relationships illustrated in the drawings. The terms are used to facilitate and simplify the description of the present disclosure, rather than indicate or imply that the devices or elements referred to herein are required to have specific orientations or be constructed or operate in the specific orientations. Accordingly, the terms should not be construed as limiting the present disclosure. In addition, the term "first", "second" are for illustrative purposes only and are not to be construed as indicating or imposing a relative importance or implicitly indicating the number of technical features indicated. Thus, a feature that limited by "first", "second" may expressly or implicitly include at least one of the features. In the description of the present disclosure, the meaning of "plural" is two or more, unless otherwise specifically defined.

In the present disclosure, the word "exemplary" is used to mean "serving as an example, illustration, or explanation". Any embodiment described as "exemplary" in the present disclosure is not necessarily construed as being more preferable or advantageous than other embodiments. In order to enable any person skilled in the art to implement and use the present disclosure, the following description is given. In the following description, the details are listed for the purpose of explanation. It should be understood that those of ordinary skill in the art can realize that the present disclosure can also be implemented without using these specific details. In other instances, well-known structures and processes will not be elaborated to avoid unnecessary details to obscure the description of the present disclosure. Therefore, the present disclosure is not intended to be limited to the illustrated embodiments, but is consistent with the widest scope that conforms to the principles and features disclosed in the present disclosure.

As shown in FIG. 1, an embodiment of the present disclosure provides a thin film transistor 100 including: a substrate 11; a gate 15 disposed above the substrate 11; a gate insulating layer 12 disposed at a side of the gate 15 away from the substrate 11; an active layer 13 disposed at a side of the gate insulating layer 12 away from the gate 15; an ohmic contact layer 14 disposed at a side of the active layer 13 away from the gate insulating layer 12. The gate insulating layer 12 includes at least a first gate insulating layer 121 deposited at a low rate, a second gate insulating layer 122 deposited at a high rate, and a third gate insulating layer 123 deposited at a low rate, the first gate insulating layer 121 is in contact with the gate 15, the third gate insulating layer 123 is in contact with the active layer 13, and the first gate insulating layer 121 and the third gate insulating layer 123 have a density greater than a density of the second gate insulating layer 122. It should be noted that the high and low rates refer to the film formation rate of the gate insulating layer 12.

Specifically, the substrate 11 may be a flexible substrate or a rigid substrate, and the flexible substrate may be a laminated structure of double-layer PI (Polyimide) substrates or a structure of a single-layer PI substrate. According to the present embodiment, a double-layer PI substrate is preferable, and an inorganic layer is provided between the double-layer PI substrates. Therefore, the laminated structure of the double-layer PI substrates can effectively block moisture and oxygen while improving the flexible bending capability of the display product, thereby improving the service life of the display product.

Specifically, the material of the gate 15 may comprise a low resistance material, such as Al, Ti, Mo, Cu, Ni, or alloys thereof, or have a multi-layer or single-layer structure of material having high corrosion resistance, which is not specifically limited herein.

Specifically, the ohmic contact layer 14 is made of ion-doped amorphous silicon.

It should be noted that the second gate insulating layer 122 formed by high-rate deposition is loose in film quality and low in film density, and can be rapidly deposited, thereby contributing to improvement of production efficiency and mass production. The film layer of the third gate insulating layer 123 formed by low-rate deposition is high in density, and can be sufficiently contacted with the active layer 13, so that while ensuring the cleaning degree of the interface between the gate insulating layer 12 and the active layer 13 and reducing the concavo-convex phenomenon of the interface is reduced, the electron mobility is improved, and the electron transport capability is excellent, thereby achieving high device performance. Therefore, by forming the gate insulating layer 12 with multilayer structures having different densities at different film forming rates, the thin film transistor 100 can be formed while taking into account device performance and production efficiency.

However, when the gate insulating layer 12 is formed by high-speed deposition, the power and the gas flow rate of the film formation are relatively large, so that the foreign matter is prone to be generated during CVD film formation. Illustratively, taking silicon nitride (SiNx) as the material of the gate insulation layer 12 of the present embodiment as an example, before the silicon nitride (SiNx) thin film is formed by CVD, a surface pre-treatment with $NH_3$ is required, and then $SiH_4$ gas is introduced to form the SiNx thin film. However, when the SiNx thin film is formed by high-rate deposition, the $SiH_4$ gas flow rate is too large, the decomposition of $SiH_4$ is insufficient, and the $NH_3$ is prone to react with the $SiH_4$ to form the abnormal SiNx, thereby forming the foreign matter (Particle).

In order to avoid generation of foreign matter, in the present embodiment, a first gate insulating layer 121 deposited at a low rate is provided between the second gate insulating layer 122 and the gate 15. At a low film-forming rate, both the power of film-forming and the $SiH_4$ gas flow rate are smaller, and the variation is relatively small compared with that of the surface pre-treatment with $NH_3$, which facilitates suppression of foreign matters generated in the conversion between the $NH_3$ surface treatment step and the SiNx film-forming step, thereby reducing the foreign matters formed in CVD film-forming, improving problems such as point defects/line defects/ESD caused by CVD foreign matters, and improving the product yield.

In the present embodiment, each of the sub-layers of the gate insulating layer 12 is made of silicon nitride (SiNx). Silicon nitride has a higher dielectric constant (k) than silicon oxide (SiOx), and the entire insulating layer is made of silicon nitride so that the gate insulating layer 12 retains a higher dielectric constant and thus has a high permittivity.

It should be noted that a material having a high permittivity has a high level of progression of the internal electric field. Therefore, when the gate insulating layer 12 has a high dielectric constant, the electric field progresses well toward the inside of the gate insulating layer 12, so that the electric field generated by the gate 15 is efficiently close to the active layer 13. In addition, the gate insulating layer 12 having a high dielectric constant further facilitates an increase in mobility of the active layer 13.

Further, generally, if the channel length of the thin film transistor 100 is shortened, the change in the threshold voltage becomes large. Assuming that a high voltage is applied to the drain, if the channel length becomes shorter, the active layer 13 is affected by the drain. Due to the effect of the drain, it has the same effect as in the case of applying an electric field to the active layer 13. Therefore, even if a weak voltage is applied to the gate 15, the current flows through the active layer 13, causing the threshold voltage of the thin film transistor 100 to be shifted. The gate insulating layer 12 having a high permittivity can prevent the influence of the drain, thereby preventing the threshold voltage offset of the thin film transistor 100.

Therefore, in the embodiment of the present invention, the gate insulating layer is made of silicon nitride, so that the mobility of the active layer 13 can be increased to prevent the threshold voltage from being shifted, thereby forming the thin film transistor 100 having a short channel.

As shown in FIG. 1, in the present embodiment, the active layer 13 includes a first active layer 131 deposited at a low rate and a second active layer 132 deposited at a high rate, the first active layer 131 is in contact with the third gate insulating layer 123, and the materials of the first active layer 131 and the second active layer 132 include amorphous silicon (a-Si).

It should be noted that, compared with the solution of microcrystalline silicon, the thin film transistor 100 formed by amorphous silicon used in the present embodiment has a low leakage amount and good reliability, and the quality of the product is effectively improved. In addition, the deposition process of amorphous silicon is simpler, and continuous deposition can save time.

It should be noted that the first active layer 131 formed by low-rate deposition has a dense film layer so that a good contact is formed between the first active layer 131 and the interface of the third gate insulating layer 123, and the first active layer 131 has a good electron transport capability. The second active layer 132 deposited at a high rate can be quickly deposited at a high film-forming rate, which can effectively improve the production efficiency and accelerate the preparation process. By preparing the first active layer 131 and the second active layer 132 using different deposition rates, it is possible to accelerate the preparation process and improve the production capacity while ensuring the performance stability of the thin film transistor 100.

Further, in the direction perpendicular to the substrate 11, the thickness of the second active layer 132 is larger than the thickness of the first active layer 131. The thickness of the first active layer 131 deposited at a low rate is made small, and process time can be saved.

In order to avoid that the material difference of the contact interface between the gate insulating layer 12 and the active layer 13 is too large, resulting in the reduction of the on-state current, in the present embodiment, the third gate insulating layer 123 is provided to include a silicon-rich silicon nitride, so that the material of the contact interface between the gate insulating layer 12 and the active layer 13 is more similar to the material of the active layer 13, thereby avoiding reduction of the on-state current. Meanwhile, in order to ensure the stability of the thin film transistor 100, except for the third gate insulating layer 123 in contact with the active layer 13, material of the remaining insulating layer is provided to include nitrogen-rich silicon nitride, that is, the first gate insulating layer 121 and the second gate insulating layer 122 include nitrogen-rich silicon nitride.

As shown in FIG. 1, in the present embodiment, the thickness of the second gate insulating layer 122 is greater than the thickness of the first gate insulating layer 121 and the thickness of the third gate insulating layer 123. The gate insulating layer 12 needs to be provided with a sufficient thickness to have a stable on-state current and a high electron mobility. The thickness of the second gate insulating layer 122 formed by high-rate deposition is set to be maximized, so that the productivity and the production efficiency can be effectively improved.

Illustratively, in other embodiments, the gate insulating layer 12 further includes a fourth gate insulating layer (not shown) between the first gate insulating layer 121 and the second gate insulating layer 122, and/or between the second gate insulating layer and the third gate insulating layer 123. That is, the gate insulating layer 12 includes the first gate insulating layer 121, the fourth gate insulating layer, the second gate insulating layer 122, and the third gate insulating layer 123 stacked in sequence; or the first gate insulating layer 121, the second gate insulating layer 122, the fourth gate insulating layer, and the third gate insulating layer 123 stacked in sequence; or the first gate insulating layer 121, the fourth gate insulating layer, the second gate insulating layer 122, the fourth gate insulating layer, and the third gate insulating layer 123 stacked in sequence.

Further, the fourth gate insulating layer may be a single-layer or multi-layer structure formed through the high-rate deposition or low-rate deposition, or a multi-layer structure of alternating high-rate deposition and low-rate deposition.

Further, the fourth gate insulating layer includes nitrogen-rich silicon nitride to ensure stability of the thin film transistor 100.

As shown in FIG. 1, in the present embodiment, the thin film transistor 100 further includes a source-drain electrode layer 16 at the side of the ohmic contact layer 14 away from the active layer 13; and a passivation layer 17 covering the source-drain electrode layers 16.

It should be noted that the source-drain electrode layer 16 may be a multi-layer or single-layer structure formed of a low-resistance material such as Al, Ti, Mo, Cu, Ni, or an alloy thereof, or a material having high corrosion resistance. Illustratively, the source-drain electrode layers 16 may be triple layers of Ti/Cu/Ti, Ti/Ag/Ti, Ti/Al/Ti, or Mo/Al/Mo, and among others.

Illustratively, the material of the passivation layer 17 includes silicon nitride. By using a silicon nitride material to form the passivation layer 17, it is possible to prevent moisture, sodium ions, and oxygen impurities from intruding into the device. Of course, in other embodiments, the passivation layer 17 may also be made of other organic insulating materials, which are not limited herein.

The present disclosure provides a method of manufacturing a thin film transistor 100, as shown in FIGS. 2A to 2E, including the following steps.

At step S101, a substrate 11 is provided.

Figure 2A:
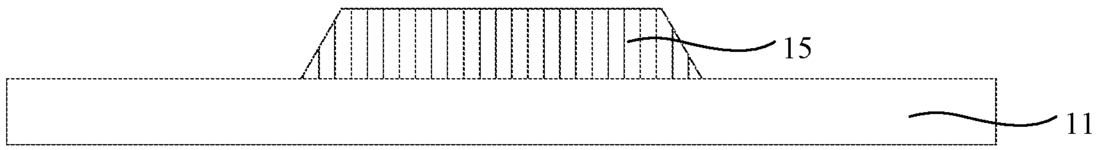
FIGS. 2A to 2E are schematic diagrams of structures during processes for manufacturing the thin film transistor according to an embodiment of the present disclosure.

At step S102, a gate 15 is formed on the substrate 11. Specifically, a first metal layer is formed on the substrate 11, and is patterned to form a gate 15, as shown in FIG. 2A.

Figure 2B:
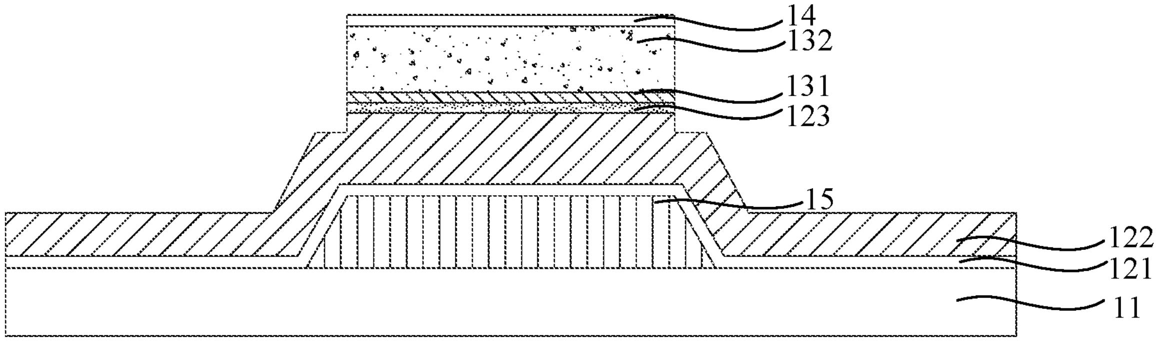

At step S103, a first gate insulating layer 121 is deposited on the gate 15 at a low rate, a second gate insulating layer 122 is deposited on the first gate insulating layer 121 at a high rate, and a third gate insulating layer 123 is deposited on the second gate insulating layer 122 at a low rate, as shown in FIG. 2B.

It should be noted that the first gate insulating layer 121 in contact with the gate 15 is formed at a relatively low film-forming rate to avoid the formation of foreign matter with the treatment gas before film formation due to excessive flow of $SiH_4$ and insufficient decomposition of $SiH_4$, which is favorable for reducing the formation of foreign matter during the film formation by the chemical vapor deposition, thereby improving problems such as point defect, line defect, ESD, and the like, caused by the foreign matter, and improving the yield.

It should be noted that the first gate insulating layer 121, the second gate insulating layer 122, and the third gate insulating layer 123 are all silicon nitride in this embodiment. Specifically, each of the four insulating layers is formed by a Chemical Vapor Deposition (CVD) method, and a low-pressure chemical vapor deposition method, a hot vapor deposition method, a catalytic chemical vapor deposition method, a plasma enhanced chemical vapor deposition (PECVD) method, and the like may be used, among which PECVD is preferable.

As the raw material gas for forming the silicon nitride film, $NH_3$, $NH_2H_2N$, $N_2$, and the like, preferably $NH_3$ and $N_2$, may be used as the nitrogen source gas, and $SiH_4$, $Si_2H_6$, $SiCl_4$, $SiHCl_3$, $SiH_2Cl_2$, $SiH_3Cl_3$, SiF, and the like, preferably $SiH_4$, may be used as the silicon source gas.

At step S104, an active layer 13 is formed on the third gate insulating layer 123, and is patterned, as shown in FIG. 2*b*.

Specifically, the first active layer 131 is deposited at a low rate on the third gate insulating layer 123, and the second active layer 132 is deposited at a high rate on the first active layer 131. It should be noted that the method of forming the active layer 13 includes, but is not limited to, PECVD or atomic layer deposition (ALD). Illustratively, the raw materials forming the first active layer 131 and the second active layer 132 are $H_2$ and silane $SiH_4$ to form the first active layer 131 and the second active layer 132 made of amorphous silicon material.

Further, the active layer is patterned.

At step S105, an ohmic contact layer 14, a source-drain electrode layer 16, and a passivation layer 17 are sequentially formed on the active layer 13.

Specifically, an ohmic contact layer 14 is formed on the active layer 13, the ohmic contact layer 14 is made of ion-doped amorphous silicon, and illustratively, the ohmic contact layer 14 is made of $N^+$; a-Si.

Figure 2C:
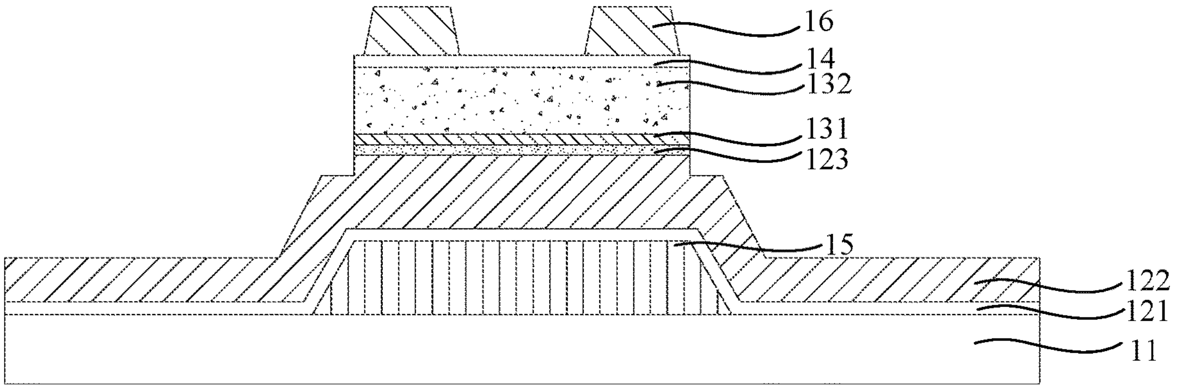

A second metal layer is formed on the ohmic contact layer 14 and patterned to form a source-drain electrode layer 16, as shown in FIG. 2C.

Figure 2D:
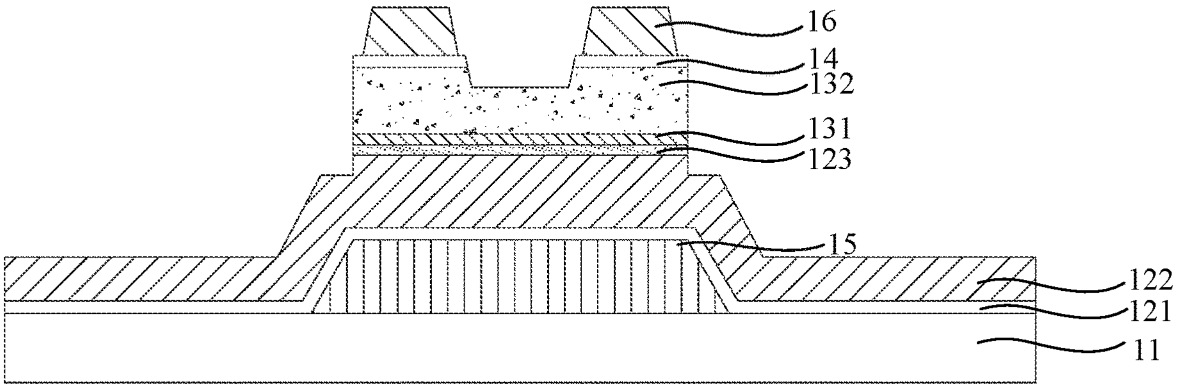

The ohmic contact layer 14 is dry-etched to expose the channel region, as shown in FIG. 2D.

Figure 2E:
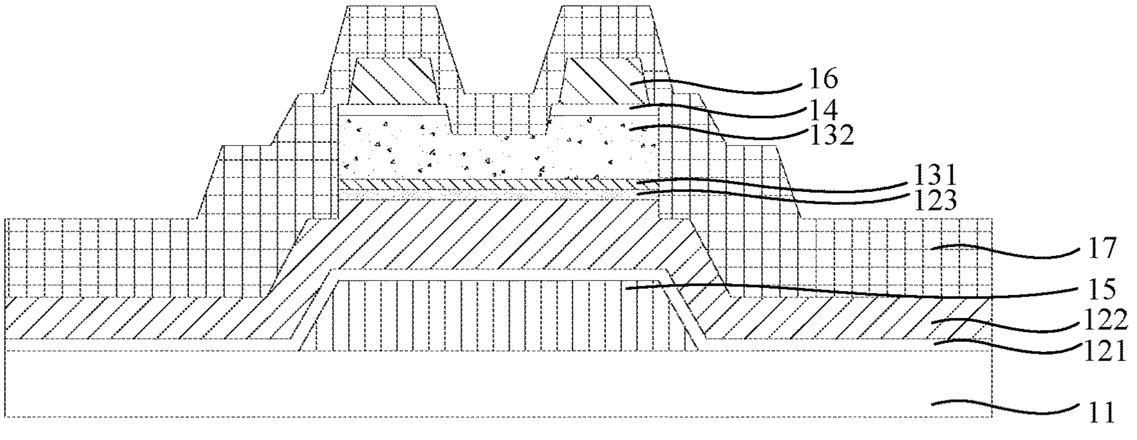

A passivation layer 17 is formed on the source-drain electrode layer 16, as shown in FIG. 2E, a method of forming the passivation layer 17 includes, but is not limited to, PECVD.

The present disclosure also provides an array substrate including the thin film transistor 100 described above.

The thin film transistor, the method for manufacturing the same, and the array substrate according to an embodiment of the present disclosure are described in detail above. The principles and embodiments of the present disclosure have been described with reference to specific embodiments, and the description of the above embodiments is merely intended to aid in the understanding of the method of the present disclosure and its core idea. At the same time, changes may be made by those skilled in the art to both the specific implementations and the scope of application in accordance with the teachings of the present disclosure. In view of the foregoing, the content of the present specification should not be construed as limiting the disclosure.

What is claimed is:

1. A thin film transistor comprising a substrate;
 a gate disposed above the substrate;
 a gate insulating layer disposed at a side of the gate away from the substrate;
 an active layer disposed at a side of the gate insulating layer away from the gate;
 an ohmic contact layer disposed at a side of the active layer away from the gate insulating layer; and
 a source-drain electrode layer disposed at a side of the ohmic contact layer away from the gate insulating layer, wherein the gate insulating layer comprises at least a first gate insulating layer deposited at a low rate, a second gate insulating layer deposited at a high rate, and a third gate insulating layer deposited at a low rate, the first gate insulating layer is in contact with the gate, the third gate insulating layer is in contact with the active layer, and each of a density of the first gate insulating layer and a density of the third gate insulating layer is greater than a density of the second gate insulating layer, wherein the gate insulating layer further comprises a fourth gate insulating layer between the first gate insulating layer and the second gate insulating layer, and/or between the second gate insulating layer and the third gate insulating layer, and the fourth gate insulating layer is a multi-layer structure.

2. The thin film transistor according to claim 1, wherein the active layer comprises a first active layer deposited at a low rate and a second active layer deposited at a high rate, the first active layer is in contact with the third gate insulating layer, and materials of the first active layer and the second active layer comprise amorphous silicon.

3. The thin film transistor according to claim 2, wherein a thickness of the second active layer is greater than a thickness of the first active layer.

4. The thin film transistor according to claim 1, wherein a thickness of the second gate insulating layer is greater than a thickness of the first gate insulating layer and a thickness of the third gate insulating layer.

5. The thin film transistor according to claim 1, wherein the first gate insulating layer and the second gate insulating layer comprise nitrogen-rich silicon nitride and the third gate insulating layer comprises silicon-rich silicon nitride.

6. The thin film transistor according to claim 1, wherein the fourth gate insulating layer comprises nitrogen-rich silicon nitride.

7. The thin film transistor according to claim 1, further comprising:
 a passivation layer covering the source-drain electrode layers.

8. An array substrate, comprising a thin film transistor, wherein the thin film transistor comprises:
 a substrate;
 a gate disposed above the substrate;
 a gate insulating layer disposed at a side of the gate away from the substrate;
 an active layer disposed at a side of the gate insulating layer away from the gate;
 an ohmic contact layer disposed at a side of the active layer away from the gate insulating layer; and a source-drain electrode layer disposed at a side of the ohmic contact layer away from the gate insulating layer, wherein the gate insulating layer comprises at least a first gate insulating layer deposited at a low rate, a second gate insulating layer deposited at a high rate, and a third gate insulating layer deposited at a low rate, the first gate insulating layer is in contact with the gate, the third gate insulating layer is in contact with the active layer, and each of a density of the first gate insulating layer and a density of the third gate insulating layer is greater than a density of the second gate insulating layer, wherein the gate insulating layer further comprises a fourth gate insulating layer between the first gate insulating layer and the second gate insulating layer, and/or between the second gate insulating layer and the third gate insulating layer, and the fourth gate insulating layer is a multi-layer structure.

9. The array substrate according to claim 8, wherein the active layer comprises a first active layer deposited at a low rate and a second active layer deposited at a high rate, the first active layer is in contact with the third gate insulating layer, and materials of the first active layer and the second active layer comprise amorphous silicon.

10. The array substrate according to claim 9, wherein a thickness of the second active layer is greater than a thickness of the first active layer.

11. The array substrate according to claim 8, wherein a thickness of the second gate insulating layer is greater than a thickness of the first gate insulating layer and a thickness of the third gate insulating layer.

12. The array substrate according to claim 8, wherein the first gate insulating layer and the second gate insulating layer comprise nitrogen-rich silicon nitride and the third gate insulating layer comprises silicon-rich silicon nitride.

13. The array substrate according to claim 8, wherein the fourth gate insulating layer comprises nitrogen-rich silicon nitride.

14. The array substrate according to claim 8, further comprising:

a passivation layer covering the source-drain electrode layers.

* * * * *